United States Patent [19]

Engelmann

[11] Patent Number: 4,987,385

[45] Date of Patent: Jan. 22, 1991

[54] HIGH EFFICIENCY POWER AMPLIFIER

[76] Inventor: Rudolph H. Engelmann, 1749 Golf Rd., #155, Mount Prospect, Ill. 60056

[21] Appl. No.: 440,667

[22] Filed: Nov. 22, 1989

[51] Int. Cl.$^5$ .............................................. H03F 3/04
[52] U.S. Cl. ...................................... 330/297; 381/120
[58] Field of Search ................ 330/202, 297; 381/120, 381/121

[56] References Cited

U.S. PATENT DOCUMENTS

| | | | |
|---|---|---|---|
| 3,753,138 | 8/1973 | Svendsen | 330/297 X |
| 4,054,843 | 10/1977 | Hamada | 330/297 X |
| 4,218,660 | 8/1980 | Carver | 330/297 |
| 4,445,095 | 4/1984 | Carver | 330/297 |
| 4,788,452 | 11/1988 | Stanley | 307/71 |

FOREIGN PATENT DOCUMENTS 4757  1/1977  Japan ..................................... 330/297

Primary Examiner—James B. Mullins
Attorney, Agent, or Firm—Leydig, Voit & Mayer

[57] ABSTRACT

A system for driving a load is disclosed comprising a programmable power supply for metering power directly to the load and a regulating element connected to the load and parallel with the programmable power supply for shunting excess power from the programmable power supply in response to a control signal in order to waveshape the power signal to the load. Sensing means are provided for sensing the power demands of the load and generating a control signal which is received by the programmable power supply. In response to the control signal, the programmable power supply meters more or less power to the load so that the power delivered directly to the load by the power supply approximately follows the power demand of the load as determined by the control signal. The power delivered by the programmable power supply is always in excess of the power demanded by it so that the regulating element continuously shunts power away from the load in accordance with the control signal in order to waveshape the power signal so as to provide a high fidelity signal to the load.

20 Claims, 3 Drawing Sheets

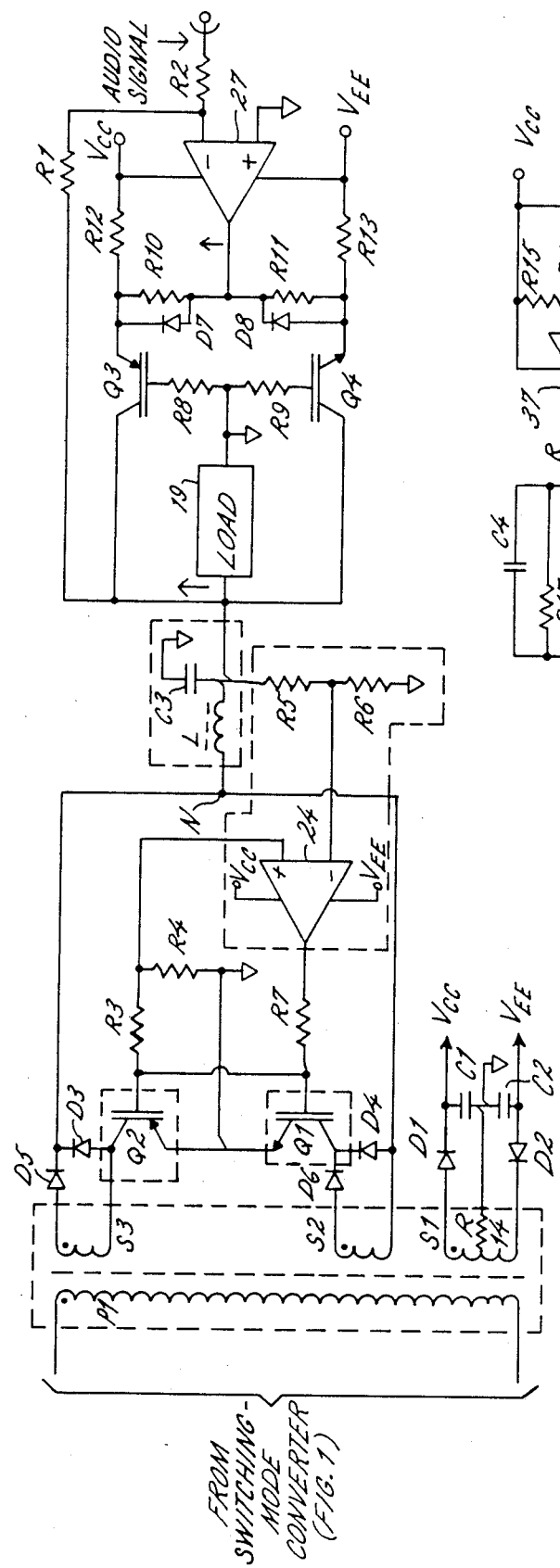
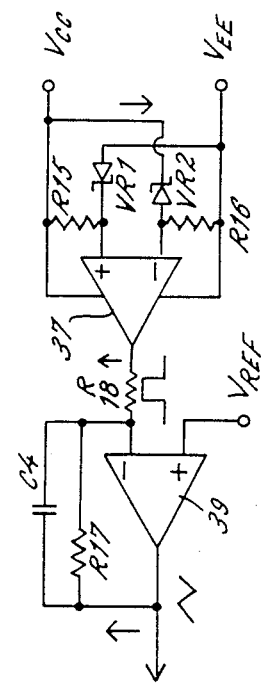
FIG. 2
FIG. 3

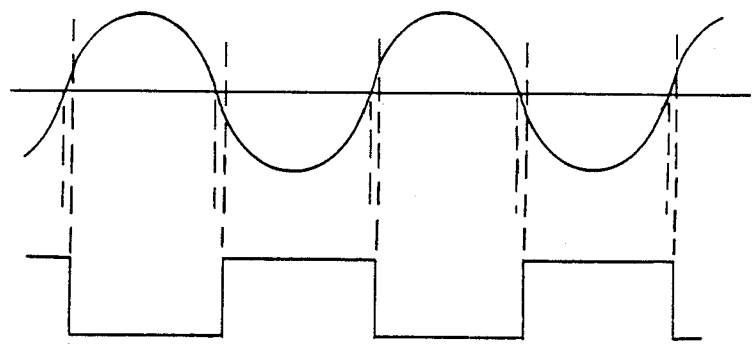
FIG. 4a AUDIO SIGNAL
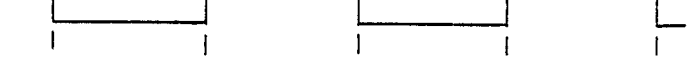
FIG. 4b POLARITY SIGNAL
FIG. 4c
$S_1 + S_2$
FIG. 4d
FIG. 4e
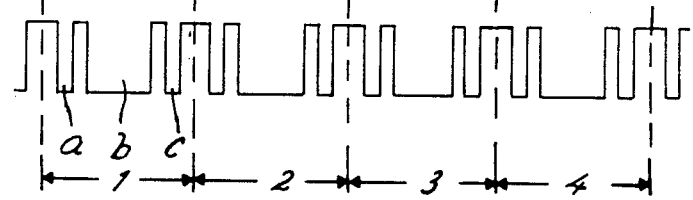
FIG. 4f POWER DEMAND

HIGH EFFICIENCY POWER AMPLIFIER

FIELD OF THE INVENTION

The invention generally relates to device drivers and more particularly to power amplifiers for driving a load.

BACKGROUND OF THE INVENTION

Conventional power amplifiers function as voltage regulators that use a programmable regulating element (e.g., a power transistor) in a series circuit comprising a power supply, the element itself and a load. A disadvantage of this approach is that all load current must pass through the regulating element. When large amounts of current are required, single regulating elements are not adequate to the conductive task and multiples of the series connected regulating element are ganged or connected in parallel to satisfy the demand for current. This format requires precise equalization of the current flows through the ganged elements to prevent disproportionate stress on any one of the ganged elements.

This equalization of current flows through ganged elements exacts a high cost from the power efficiency of the overall system. In order to enhance the system efficiency, it is known to provide multiple voltage levels for the amplifier supply rails, with the higher levels being switched in as clipping becomes imminent at each preceding lower voltage level. Other series-type designs strive to provide a continuously variable supply rail in synchronous proportion to the demand represented by a low-level input signal. In addition to suffering from narrow frequency constraints and substantial power limitations, these designs retain a series flow of power through the regulating element. In most systems, these regulating elements are the single most significant limiting factor in improving overall system efficiency.

SUMMARY OF THE INVENTION

The primary object of the invention is to provide a device for driving a load in accordance with a control signal having an efficiency much greater than conventional drives using series-connected regulators. In this connection, it is a related and more particular object of the invention to provide a high efficiency audio amplifier for driving a speaker.

Another object of the invention is to provide a high power amplifier for driving a load that is significantly less bulky and heavy than present amplifiers of the same power rating while producing a high fidelity driving signal.

Related to the foregoing objects, it is a further object of the invention to provide a load driving system that generates significantly less heat than present systems of comparable power ratings.

Briefly, the foregoing objects and others are achieved in accordance with the invention by providing a programmable power supply that directly meters power to a load and trims the power signal by way of a shunt-connected regulating element that ensures a high fidelity signal to the load. The shunt-connected regulating element primarily functions in accordance with a control signal (e.g., audio signal) to bleed excess power availed to the load by the programmable power supply. The system is designed to meter power from the power supply that is typically slightly in excess of that called for by the control signal. Because the power delivered to the load is nominally slightly more than required in response to the control signal at the input of the regulating element, this element shunts and dissipates as heat only the excess power, thereby functioning to waveshape the less accurate power signal taken directly from the power supply rather than conducting and waveshaping the entire load current flow as in conventional systems.

Under low signal or load conditions, a minimal, but measurable, amount of power is metered through the programmable power supply to the load. As the power demand by the load or control signal increases, the regulating element will initially reduce its conductivity as it allows a greater portion of available power to enter the load. Current bled away from the load is directed to a low voltage supply that is unprogrammable, but is "soft" in that its instantaneous voltage varies with its load, which is the regulating element. As this variation or modulation approaches the unprogrammable power supply limit the programmable power supply is cued to decrease the amount of power metered directly to the load. As the amount of metered power returns toward the minimal value, the control signal may at any instant be requesting more power to the load than provided by the converter and, as a result, the amplitude of the modulation on the power rails of the regulating element will begin to decrease and cue an increase of power from the power converter to the load.

Considered over a discrete period of time, the power converter may be viewed as alternating between two modes. In a first mode, a minimal amount of power is metered to the load. In a second mode, the amount of power to the load is increased in a linear relationship with respect to the amount of time a continuous demand for additional power is derived from the modulations on the power rails of the regulating element. Immediately prior to a demand for more power from the power converter, the regulating element is required to bleed or shunt less and less power away from the load and the unprogrammed power supply voltage rises. Detection of this rising voltage causes the detector or shunt-power monitor 31 to cue the programmable power supply to increase its output. This increase adds to the excess power available to the load. The regulating element responds by drawing more current and thereby preserves the fidelity of the load signal. The additional regulating current is taken to the unprogrammed power supply, thereby causing its voltage to fall and balance the loop.

The intent of the invention is to provide power directly to the load from the converter while the regulating element shunts away and dissipates excess power from the load in conformance to the control signal. In this regard, power converters as systems are significantly more efficient than series regulating elements. By driving the load primarily directly from the converter and waveshaping the signal by way of the shunting element, an amplifier/driving system is provided that is significantly more efficient than presently known driving systems in which all energizing flow to the load passes through the regulating element.

By directing the power supply immediately to the load, a significant improvement in overall system efficiency is realized for virtually any type of application. In a preferred embodiment of the invention, an audio amplifier is contrived to drive a speaker as illustrated herein. Those skilled in the art of device drivers will appreciate the application of this invention beyond audio systems such as, for example, motor drive systems.

BRIEF DESCRIPTION OF THE DRAWINGS

A preferred embodiment of the present invention will be described with reference to the following drawings in which like items are indicated by the same reference number:

FIG. 2 is a detailed schematic of various ones of the functional blocks in FIG. 1, illustrating the specific devices comprising each of the blocks and their interconnections;

FIG. 3 is a detailed schematic of the functional block in FIG. 1 for sensing the instantaneous power requirements of a load; and FIG. 4 is a timing diagram of selected idealized waveforms of the power signals present at various points within the amplifier/power driving system, assuming a simple sinusoidal input or control signal.

DESCRIPTION OF THE PREFERRED EMBODIMENT OF THE INVENTION

Figure 1:
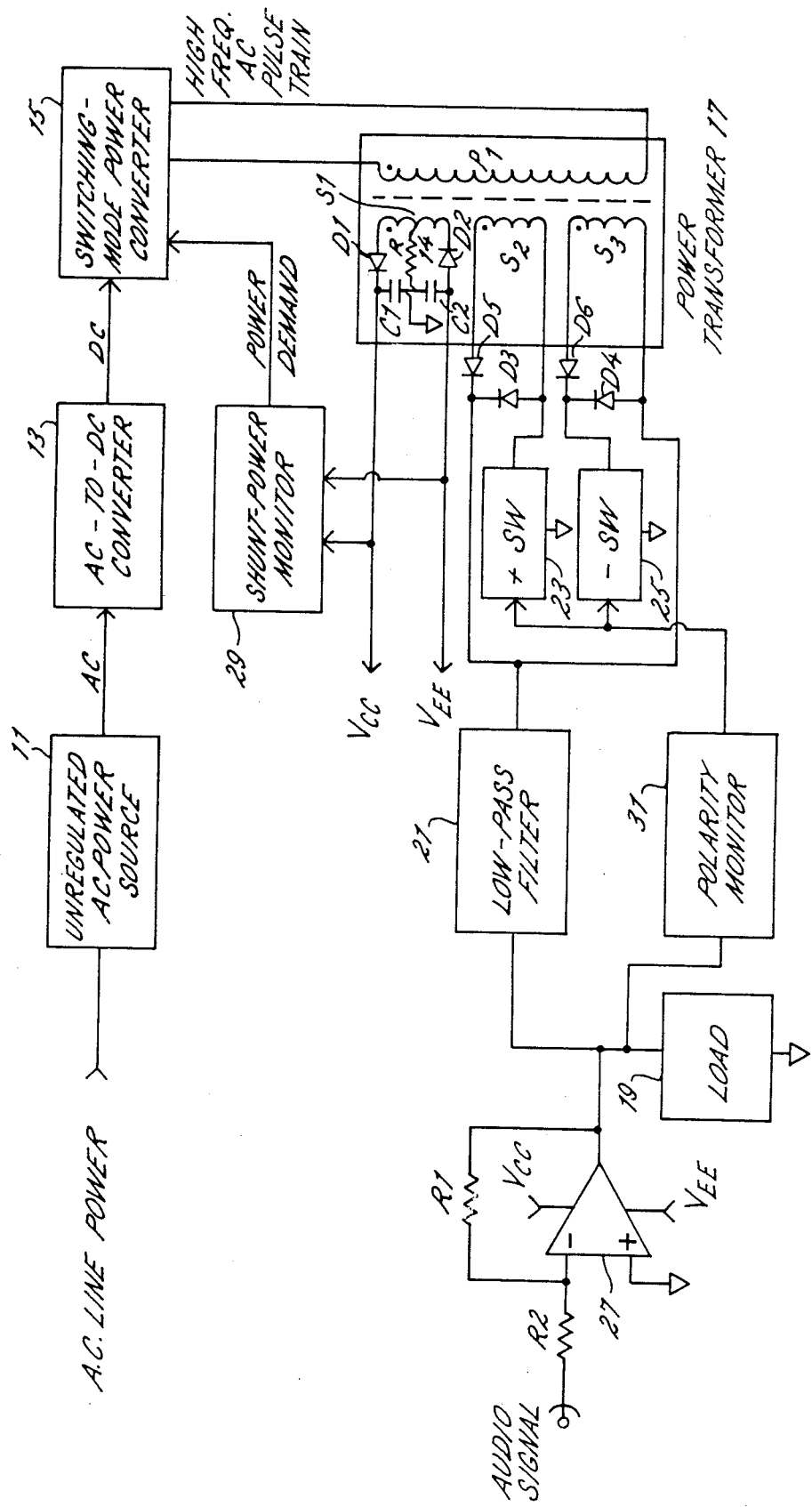
FIG. 1 is a functional block diagram of an amplifier/power driving system in accordance with the invention.

Turning to the drawings and referring first to FIG. 1, an unregulated AC power source 11 (e.g., line power from a public utility) is applied to a conventional AC-to-DC converter 13 such as a full-wave rectifier and filter means. The DC output of the converter is applied to a switching-mode power converter 15 that provides a high-frequency pulse train to the primary winding of power transformer 17. In transformer 17, the switching signal across the primary winding induces secondary emf values across three independent secondary windings S1, S2 and S3.

The AC signal across secondary winding S1 is rectified and filtered by diodes D1 and D2 and capacitors C1 and C2 to form unprogrammed power rails $V_{CC}$ and $V_{EE}$. The AC signals on secondary windings $S_2$ and $S_3$ are rectified and directed to load 19 by way of a low-pass filter 21 and switches 23 and 25 as explained hereinafter.

Power supply voltages $V_{CC}$ and $V_{EE}$ are applied to a regulating element in the form of an operational amplifier 27 conventionally configured by input and feedback resistors R2 and R1, respectively, to provide a gain control. A control signal such as an audio signal is applied to the inverting input of the amplifier 27 via resistor R2. The positive input of the amplifier is referenced to ground.

In accordance with one important aspect of the invention, metered power is directed to the load 19 by switches 23 and 25 such that the metered power is nominally in excess of that demanded by the load. Amplifier 27 shunts the excess power away from the load and thereby leaves a continuum of instantaneous load signal values that are highly faithful to the control signal applied to the amplifier. By way of example, consider an initial condition where the control signal is near zero. This condition requires a minimum of power from the programmed power converter 15 to the load 19. The amplifier 27 shunts and dissipates the power that exceeds the control signal demand. As the control signal increases, the instantaneous power demand of the load 19 increases accordingly. In response to low level demand for more power, the amplifier or element 27 first simply shunts less power away from the load. At some point of increasing demand, the minimal amount of power metered from the programmed power converter 15 is insufficient and the amplifier 27 conductivity approaches zero and the power rail voltages $V_{CC}$ and $V_{EE}$ approach maximum values. This modulation of the power rail voltages is detected by a shunt-power monitor 29 that cues the power converter 15 to provide more power to the load. With more power applied to the load, the modulation of $V_{CC}$ and $V_{EE}$ increases and the power monitor 29 allows the converter 15 to stabilize or return toward its minimal setting. The power converter 15 operates between the states of minimal power production and instantaneous power increases cued by the shunt-power monitor 29. Operating over this varying range, the power converter 15, transformer 17, low-pass filter 21 and switches 23 and 25 effectively provide instantaneous values of power that are slightly excessive, but roughly faithful to the amplitude of the control signal. The amplifier 27 under the control of the control signal trims the excess power output from the converter 15 by sinking power from the load 19 in order to maintain the fidelity of the load signal to the control signal.

The power converter 15 varies its power output by application of pulse-width (PWM), amplitude, frequency or other modulation techniques. In this regard, differing available converters can be appropriate for the power converter 15. An example of an acceptable PWM converter may be found at page 16 of the "Applications Handbook 1985–86", published in 1985 by Unitrode Corporation, 5 Forbes Rd, Lexington, Mass. 02173. For higher rated power levels (e.g., >300 watts), a PWM converter may be unacceptably noisy for audio applications. For these applications of the invention, I prefer an amplitude modulated converter such as set forth in my U.S. Pat. No. 4,717,889. Both the foregoing patent and handbook are incorporated herein by reference. There may be other applications, however, where electromagnetic noise is not an important factor and in such cases a PWM converter may prove to also be appropriate for operation at higher power levels. Depending on the specific application, other types of converters known in the art may also be appropriate for use as the power converter 15, e.g., frequency-modulated converters as exemplified by certain series-resonant and parallel-resonant converters.

To meter power to the load directly from the power supply so that it is in correct polarity with the power signal to the load 19, the switches 23 and 25 alternately open and close to pass power from either secondary windings S2 or S3, but not both, to the low-pass filter 21 and thence to the load 19. Diodes D3 and D4 are associated with the secondary windings S2 and S3, respectively, to provide a commutation path for the inductive element of the low-pass filter when a switch is opened as is well known in the art. Diodes D5 and D6 half-wave rectify the signals from the secondary windings S2 and S3 to provide positive and negative load voltage options with respect to ground.

To alternately open and close the switches 23 and 25, a polarity monitor 31 senses the voltage and polarity of the power applied to the load 19 and generates a bi-state output signal that closes one or the other switches 23 and 25. When the input signal to the load 19 exceeds a predetermined positive level, the output of the polarity monitor 31 switches to a first state which causes switch 23 to close and pass power from the secondary winding S2 to the low-pass filter 21 and the load 19. The output of the polarity monitor 31 stays in its first state until an excursion of the load signal passes a predetermined negative hysteresis level that forces the output of the polarity monitor 31 to switch to a second state that opens switch 23, while closing switch 25 and thereby allowing power from the secondary winding S3 to be transferred to the load. By switching power from secondary windings S2 and S3 to the load 19 in the foregoing manner, the power is metered essentially in phase with the voltage signal at the load, thereby coordinating the shunting function of the amplifier 27 with the power metering function of the power converter 15 and power transformer 17. By providing for the polarity monitor 31 to switch states at a non-zero value of the power signal, any noise generated by the switches 23 and 25 occurs at a significant power output level to enhance the signal-to-noise ratio.

As a programmable power supply, the power converter 15, transformer 17, switches 23 and 25 and low-pass filter 21 comprise in essence a non-precise (i.e., not precisely linear) amplifier responsive to a power demand signal from the shunt-power monitor 29. As will be appreciated by those familiar with power converters, the signal across the primary winding P1 of the power transformer 17 rises and falls or reverses periodically at a relatively high frequency (e.g., 200 KHz). This high frequency is a carrier for the power being metered to the load 19 and is therefore filtered out of the power signal at the low-pass filter 21 inside an envelope drawn by the control signal.

Referring now to FIGS. 2-4, the switches 23 and 25 are realized by NPN transistor Q1 and PNP transistor Q2, respectively. The polarity monitor 31 controlling the transistors Q1 and Q2 is a comparator 24 with resistors R3 and R4 determining the hysteresis levels. A voltage divider network of series-connected resistors R5 and R6 provides for a sensing voltage at the inverting input to comparator 24. Resistor R7 is placed to limit base current into transistors Q1 and Q2.

In the waveform timing diagram of FIGS. 4a-4f, the polarity signal from the output of the comparator is shown as waveform (b) with respect to an audio sinusoid control signal shown as waveform (a). The voltage waveform (a) corresponds to a voltage waveform across the load in approximately the same phase. As can be seen from an inspection of waveforms (a) and (b), the switching hysteresis of the polarity monitor that minimizes the discernable noise introduced by the switching of transistors Q1 and Q2 and rectifiers D3-D6 in response to the instantaneous polarity requirements of the load.

With particular reference to the timing of the waveforms in FIGS. 4a-f, two complete cycles of an audio input control signal are shown. The waveforms generated by the sinusoidal audio signal are somewhat scaled to aid understanding of the invention and are not intended to be precise representations of exemplary waveforms. Each waveform diagram is divided into four time segments, each corresponding to a half-cycle of the control signal. The simple wave chosen to illustrate the operation of the circuit in FIGS. 2 and 3 forms a repetitive pattern that rotates vectorially through 360 degrees of arc (e.g., a sinusoidal wave). Therefore, only the details of the portions of the waveform (b)-(f) in time segment one (1) will be discussed herein since the details of those waveforms in time segments two (2), three (3), and four (4) essentially repeat the pattern and dynamics set forth in time segment one (1).

Returning to FIG. 2, a transistors Q1 and Q2 are alternately turned on and off in response to the polarity signal (waveform b). Metered power is delivered to node N in FIG. 2, where the power outputs of secondary windings S1 and S2 are confluent. In order to provide for the low-pass filter 21 of FIG. 1, an inductor L and a capacitor C4 are configured in a conventional low-pass arrangement as shown in FIG. 2. For an amplitude modulating power converter 15, the waveform at node N varies in amplitude, while time or duty-cycle is constant, according to waveform (c) of FIGS. 4a-4f. As previously indicated, however, a PWM converter may be used in low power applications where noise, peak currents and component size do not extend beyond practical feasibility. Using a PWM converter 15, the waveform at node N is exemplified by waveform (d) in FIG. 4d. In either instance, amplitude modulation or PWM, the instantaneous current into the low-pass filter varies in a sawtooth waveform as exemplified by waveform (e) in FIG. 4e.

For the amplifier 27, the gain is determined by the ratio of resistor R1 to resistor R2. The amplifier 27 and comparator 33 may both be satisfied by one of a genre of devices exemplified by type numbers LM12 and LM1875 manufactured and sold by National Semiconductor. Because the supply voltage limitations specified for these and other similar devices are not sufficient to include load voltages encountered in higher power systems, common-base buffers Q3 and Q4 are inserted to extend the acceptable load voltage range under control. Resistors R10 and R11 determine the level of class A current through transistors Q3 and Q4. This class A current is supplied from $V_{CC}$ and $V_{EE}$ via resistors R12 and R13. Diodes D7 and D8 bypass resistors R10 and R11 as higher levels of shunt current are needed to maintain the fidelity of the load signal to the control signal. Resistors R8 and R9 prevent clamping of the output from amplifier 27.

A specific embodiment of the shunt-power monitor 29 is illustrated in FIG. 3. As previously explained in connection with FIG. 1, the monitor 29 senses modulation of the power rail voltages $V_{CC}$ and $V_{EE}$. The voltages $V_{CC}$ and $V_{EE}$ are derived from a power supply comprising secondary winding S1, diodes D1 and D2, capacitors C1 and C2 and resistor R14. In a conventional manner diodes D1 and D2 each half wave rectify the AC signal on the secondary winding S1 while capacitors C1 and C2 filter the high frequency in order to provide positive and negative DC voltages with relatively low high-frequency ripple. A center tap on the secondary winding S1 is connected to a reference ground by way of resistor R14 that drops voltage across C1 or C2 in proportion to current being drawn from C1 or C2.

In order to sense modulation of the power rails $V_{CC}$ and $V_{EE}$, two Zener diodes VR1 and VR2 refer the voltages to the inputs of a comparator 37 such as an LM311 by National Semiconductor. Resistors R15 and R16 provide biasing current for the Zener diodes. The values of the Zener diodes VR1 and VR2 are chosen so that the inverting input to the comparator 37 normally has a positive voltage relative to the voltage at the non-inverting input. As the instantaneous power drawn from the load 19 exceeds that available from capacitors C1 and C2, one of the voltages $V_{CC}$ or $V_{EE}$ will be drawn toward ground potential. As the voltage $V_{EE}$ is lowered the voltage at the non-inverting input of the comparator 37 is forced positive with respect to the voltage at the inverting input and the comparator output voltage is forced high. Correspondingly, as the voltage $V_{CC}$ is drawn toward ground potential, the voltage at the inverting input will be forced negative with respect to the voltage at the non-inverting input and the comparator output voltage is again forced high.

Waveform (f) of FIG. 4f illustrates the output of the comparator 37, wherein the control signal, FIG. 4a, demands delivery of more power to the load 19 than the sum of the unprogrammed power and the minimal programmed power. It can be seen from an inspection of waveforms (a) and (f) that the output of the comparator 37 is high when the control signal is near ground potential. As the control signal voltage rises in either a positive or negative direction, less and less power is shunted by amplifier 27. The voltages $V_{CC}$ and $V_{EE}$ both approach their unloaded values and, as a result, the output of the comparator 37 is forced low.

The output of the comparator 37 is led through resistor R18 to an input of an error amplifier 39. Resistors R17 and R18 determine the DC gain of amplifier 39. The error amplifier 39 is an integral circuit of switching controllers such as a UC1844 by Unitrode. In this example of a PWM programmable power supply, a low signal at the input of the power converter 15 causes the pulse width of the output to increase. Conversely, a high signal at the input of the converter 15 causes the output pulse width to decrease. Therefore, as the voltages $V_{CC}$ and $V_{EE}$ rise, the power output from the programmable power supply will increase. The system of the invention strives to keep the amplifier 27 in a conductive state at all times; i.e., bleeding some value of power from the gross power availed to the load by the programmable power supply.

As stated previously, PWM is one of many types of power modulation that may be used in this invention. In the example shown in FIG. 3, the response of the error amplifier 39 is mitigated by the integrating effect of capacitor C4, and resistors R17 and R18 as explained for example in the Unitrobe application notes for the UC1844.

In summary, the invention contrives the power converter 15 to directly meter power to the load 19 in approximate proportion to the instantaneous power demand of the load as determined by the control (audio) input signal. The linear amplifier 27 would traditionally regulate power to the load by precisely metering power through itself. In other words, the amplifier 27 has traditionally been connected in a series relationship with respect to the flow of power to the load. In the system for driving a load according to the present invention, however, the amplifier 27 is not in a series relationship with respect to the load 19. Instead, it is in a parallel relationship in that the amplifier sinks power in dependence on the amount of power metered directly to the load from the power converter 15 relative to the demand for power by the load as determined by the control signal. In order to approximate in a dynamic manner availed power to instantaneous power demands of the load, the shunt-power monitor provides a programming signal to the converter 15, which further responds by changing its output of instantaneous power that is availed to the load.

I claim:

1. A system for driving a load comprising in combination:
    a programmable power supply for metering power directly to a load, the supply having an input for controlling the amount of power metered to the load;
    a regulating element connected to the load in parallel with the programmable power supply and responsive to a control signal for shunting excessive power delivered to the load by the programmable power supply;
    means for sensing load demands for more or less power than the programmable power supply is instantly providing, generating a signal indicative of the demand and applying it to the controlling input of the programmable power supply; and
    the programmable power supply being responsive to the sensing means for adjusting the amount of instantaneous power delivered to the load.

2. A system as set forth in claim 1 wherein the programmable power supply includes first and second switching means for controlling the polarity of delivering the power metered to the load.

3. A system as set forth in claim 2 wherein the switching means includes a means for detecting the polarity of the signal to the load and switching polarity of the signal delivering the metered power at a time when the signal to the load is at a significantly non-zero value in order to achieve a high signal-to-noise ratio.

4. A system as set forth in claim 1 wherein the programmable power supply includes a transformer.

5. A system as set forth in claim 4 wherein the transformer includes at least first, second and third secondaries, the first secondary forming part of a bi-polar unprogrammed power supply for the regulating element, the second and third secondaries connected by rectifiers to a low-pass filter by way of a switching means that connects the programmable power supply to the load in the polarity of the metered power that is at all times consistent with instantaneous values of the control signal.

6. A system as set forth in claim 1 wherein the load is an audio speaker and the control signal is an audio signal.

7. A system as set forth in claim 6 wherein the programmable power supply is a power converter that controls the amount of power metered to the load by way of pulse-width modulation.

8. A system as set forth in claim 6 wherein the programmable power supply is a power converter which controls the amount of power metered to the load by way of amplitude modulation.

9. A system as set forth in claim 8 wherein the programmable power supply includes low-pass filtering of a carrier frequency from a signal envelope of metered power to the load.

10. A system as set forth in claim 1 wherein the programmable power supply is a non-linear amplifier of the control signal.

11. A system as set forth in claim 10 wherein the regulating element is a linear amplifier of the control signal.

12. A system as set forth in claim 11 wherein the non-linear amplifier includes a variable gain responsive to the signal from the sensing means.

13. A system as set forth in claim 12 wherein the regulating element has a fixed gain.

14. A system as set forth in claim 1 wherein the sensing means includes a monitor for sensing modulation of a power signal by the regulating element.

15. A method of driving a speaker comprising the steps of:
    responding to the audio signal by applying a first power signal to the speaker by way of a non-linear amplifier; and shunting a portion of the first power signal away from the speaker by way of a linear amplifier responsive to the audio signal in order to waveshape the first power signal.

16. A method as set forth in claim 15 wherein the step of responding to the audio signal includes the step of monitoring the linear amplifier power rails, and providing a power demand signal indicative of modulation of the power rail voltages caused by the audio signal.

17. A method as set forth in claim 16 wherein the step of responding to the audio signal includes the step of pulse-width modulating a carrier signal in response to the power demand signal, wherein the carrier signal comprises the first power signal.

18. A method as set forth in claim 17 wherein the step of responding to the audio signal includes the step of filtering the carrier signal from the first power signal envelope prior to application to the speaker.

19. A method as set forth in claim 16 wherein the step of responding to the audio signal includes the step of amplitude modulating a carrier signal in response to the power demand signal, wherein the carrier signal comprises the first power signal.

20. A method as set forth in claim 15 wherein the step of responding to the audio signal includes the step of controlling the polarity of the first power signal by reference to the polarity of the audio signal present across the load.

* * * * *